United States Patent [19]

Evans

[11] Patent Number: 5,065,308

[45] Date of Patent: Nov. 12, 1991

[54] PROCESSING CELL FOR FAULT TOLERANT ARRAYS

[75] Inventor: Richard A. Evans, Malvern, England

[73] Assignee: The Secretary of State for Defence in Her Britannic Magesty's Government of the United Kingdom of Great Britain and Northern Ireland, London, England

[21] Appl. No.: 659,538

[22] Filed: Feb. 22, 1991

Related U.S. Application Data

[63] Continuation of Ser. No. 579,194, Sep. 7, 1990, abandoned, which is a continuation of Ser. No. 402,705, Sep. 5, 1989, abandoned, which is a continuation of Ser. No. 818,365, Jan. 13, 1986, abandoned.

[30] Foreign Application Priority Data

Jan. 29, 1985 [GB] United Kingdom ................ 8502186
Jun. 20, 1985 [GB] United Kingdom ................ 8515649

[51] Int. Cl.$^5$ ..................... G06F 11/16; G06F 11/20
[52] U.S. Cl. .................................. 395/800; 371/9.1;
371/11.3; 364/266.5; 364/267.7; 364/268;
364/268.9; 364/268.3; 364/DIG. 1
[58] Field of Search ... 364/200 MS File, 900 MS File;
371/8.1, 9.1, 11.1, 11.3

[56] References Cited

U.S. PATENT DOCUMENTS

| | | | |
|---|---|---|---|
| 3,970,993 | 7/1976 | Finnila | 364/200 |
| 4,247,892 | 1/1981 | Lawrence | 364/200 |
| 4,304,002 | 12/1981 | Hunt | 371/49 |
| 4,415,973 | 11/1983 | Evans | 364/200 |
| 4,467,422 | 8/1984 | Hunt | 364/200 |
| 4,519,035 | 5/1985 | Chamberlain | 364/200 |
| 4,591,980 | 5/1986 | Huberman et al. | 364/200 |
| 4,593,351 | 6/1986 | Hang et al. | 364/200 |
| 4,698,807 | 10/1987 | Marwood et al. | 371/11 |

OTHER PUBLICATIONS

Mendelsohn, A., "Self–Testing ICs begin to Emerge–Tentatively," Electronics, Feb., 1986, pp. 33–36.
Daniels, R., et al., "Built–In Self-Test Trends in Motorola Microprocessors," IEEE Design and Test, Apr., 1985, pp. 64–71.
Komonytsky, Donald, "LSI Self-Test Using Level Sensitive Scan Design and Signature Analysis," IEEE Test Conference Proceedings, 1982, Paper 14.3, pp. 414–424.
Sami et al., "Reconfigurable Architectures for VLSI Processing Arrays", National Computer Conference, AFIPS Conference Proceedings, Anaheim, Calif. May 16–19, 1983, pp. 567–577.

*Primary Examiner*—Eddie P. Chan
*Attorney, Agent, or Firm*—Nixon & Vanderhye

[57] ABSTRACT

A process cell is provided for use in constructing fault tolerant arrays. It contains a processor arranged to indicate a faulty or fault-free operational state. The cell is arranged to receive input from any one of the three western neighbors, and to provide output to any one of three eastern neighbors. It both generates and receives connection request and availability signals. Internal logic ensures its becoming connected as part of an operational (not necessarily straight) row of cells in an array if and only if the processor is fault-free and it receives at least one pair of true request and availability signals from respective eastern and western neighbors. The internal cell logic implements a priority scheme in which connection to a more northern neighbor to east or west is preferred to connection to one more southern. This avoids any mid-array connection hiatus. Further embodiments of the invention provide for configurable columns of cells in addition to the foregoing row reconfiguration.

6 Claims, 10 Drawing Sheets

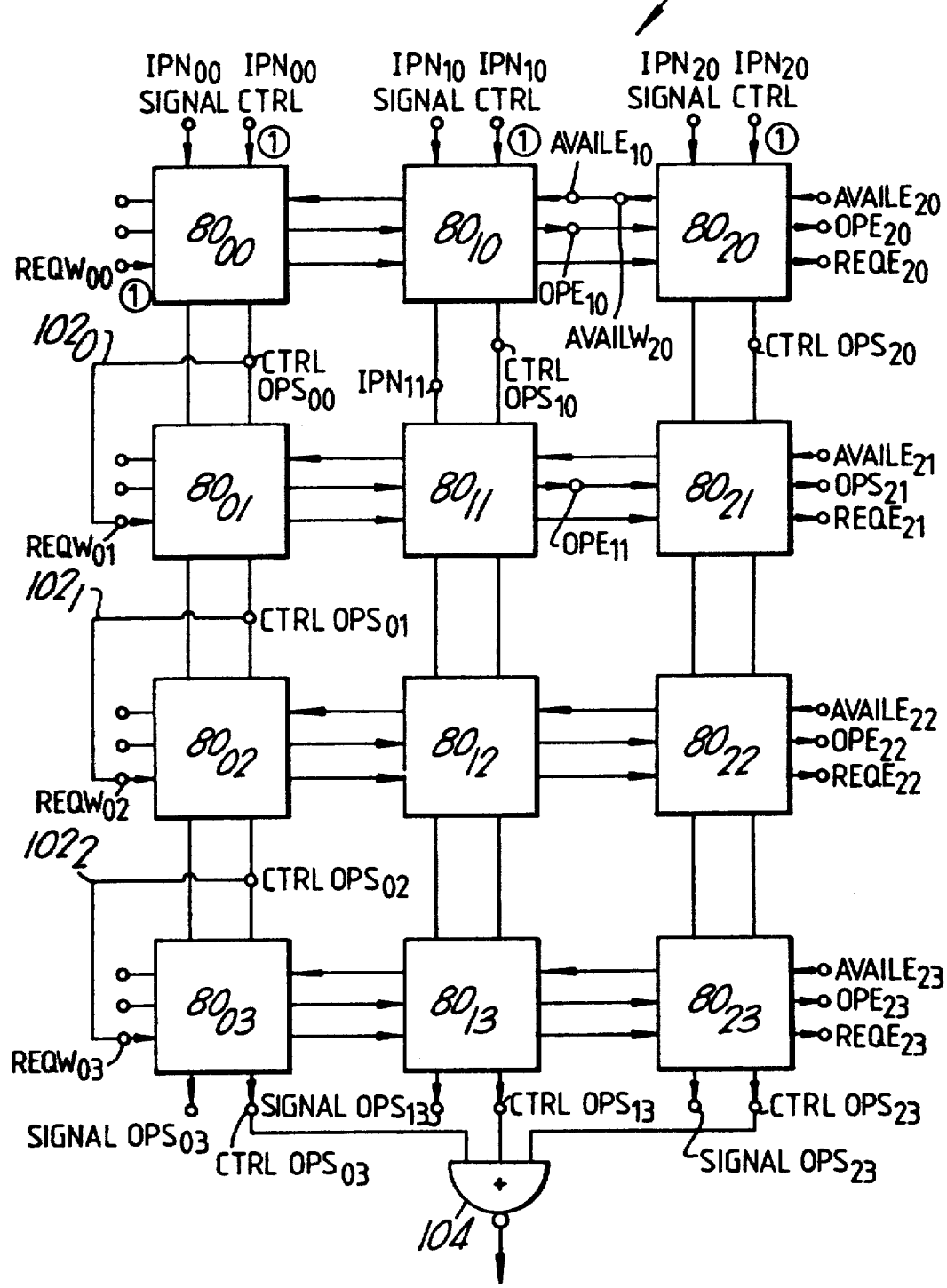

PROCESSING CELL FOR FAULT TOLERANT ARRAYS

This is a continuation of application Ser. No. 07/579,194, filed Sept. 7, 1990, now abandoned, which is a continuation of Ser. No. 06/402,705, filed Sept. 5, 1989, now abandoned, which is a continuation of Ser. No. 06/818,365, filed Jan. 13, 1986, now abandoned.

FIELD OF THE INVENTION

This invention relates to a processing cell for fault tolerant arrays, i.e., the cell is intended as a building block for use in constructing fault-tolerant arrays of processing cells.

BACKGROUND OF THE INVENTION

Fault tolerant arrays of cells are known. United Kingdom Patent No. 2021825B describes a two dimensional wafer-scale array of integrated circuits (ICs) such as shift registers combined to provide a parallel memory. The array is initially tested to identify faulty ICs, and an external control circuit ensures that the faulty ICs are not implemented. The testing requirement is time-consuming and therefore expensive. The need for a separate control circuit communicating with all ICs leads to loss of wafer area to connecting lines. Moreover, the control circuit is of a different type to that of the ICs, which complicates design and production.

U.S. Pat. No. 3,913,072 describes the formation of a fully operational one-dimensional or linear array of ICs from a partly faulty two-dimensional wafer-scale array. A viable IC is first selected and connections are made to a further viable IC selected from four nearest neighbours. IC testing is carried out from an offwafer source. The procedure is carried out until a chain of ICs of the required length is built up. The circuitry for IC testing, selection and connection is complex. Furthermore, the procedure is only capable of providing a one-dimensional array of ICs in series.

SUMMARY OF THE INVENTION

It is an object of the present invention to provide a processing cell for constructing a fault-tolerant cell array, the cell not requiring external testing and being arranged for use in arrays automatically configurable to omit faulty cells.

The present invention provides a processing cell for use in constructing fault tolerant cell arrays, the cell including:
(a) a processor for performing electronic operations on input signals and arranged to indicate its operational state, i.e., faulty or fault-free;
(b) a respective set of first, second and third lines for each of the following:
 (1) processor input signals,
 (2) processor output signals,
 (3) input availability signals,
 (4) input request signals,
 (5) output availability signals, and
 (6) output request signals,
wherein each processor input signal line is associated with a respective input request signal line and a respective output availability signal line and each processor output signal line is associated with a respective output request signal line and a respective input availability signal line;
(c) request signal generating means arranged to provide output request signals reflecting both processor operational state and input request and availability signals;
(d) availability signal generating means arranged to provide output availability signals reflecting both processor operational state and input request and availability signals; and
(e) cell implementing means arranged to route signals to and from the processor via an input signal line and an output signal line both selected in accordance with respective associated input request and input availability signals and processor operational state.

The processing cell of the invention is intended for use as a building block in constructing fault-tolerant cell arrays. It provides the advantage that a cell is arranged to be operationally included within an array if and only if it has a fault-free processor and it receives input request and availability signals indicating that neighbouring cells are available for connection to it. The cell also generates its own availability and request signals for transmission to neighbouring cells indicating routes available for signal transmission through the array. It achieves this without reference to or need for any external test or control circuits.

In a preferred embodiment, the cell implementing means is arranged to operate a priority scheme in which use of each of the second input and output signal lines is preferred to use of the respective third, and use of each of the first input and output signal lines is preferred to use of the respective second. This provides the advantage that a cell connection hierarchy can be established in one direction through an array, thus avoiding a cell interconnection hiatus in mid-array. Furthermore, the priority scheme makes it possible to provide for automatic array reconfiguration to nullify the effects of in-service cell failure.

The cell may include a further input line and a further output line, these being arranged either to route additional signals to and from the processor or to bypass it in accordance with whether or not the processor is fault-free. This arrangement makes provision for signal transmission in an additional direction through a cell array, the direction being functionally orthogonal to that previously indicated.

An array of processing cells of the invention nay be arranged in combination with an array of input cells and an array of output cells. The input cell array is arranged to configure input to the processing cell array such that only operational rows of processing cells receive processor input signals. Similarly, the output cell array is arranged to configure outputs from the array such that only operational rows of processing cells are addressed to provide output signals. One of the input and output cell arrays may be provided with means arranged to indicate whether or not a predetermined minimum number of operational rows of processing cells is available.

The cells of the invention may be arranged to be suitable for forming an array which is reconfigurable in two dimensions, i.e., an array having variable numbers of both rows and columns. In this embodiment the invention would be arranged to avoid double site and improper crossover problems to be described.

BRIEF DESCRIPTION OF THE DRAWINGS

In order that the invention might be more fully understood, embodiments thereof will now be described, by way of example only, with reference to the accompanying drawings, in which:

FIG. 5 schematically shows an array of FIG. 4 cells;

DETAILED DESCRIPTION OF PREFERRED EMBODIMENTS

Figure 1:
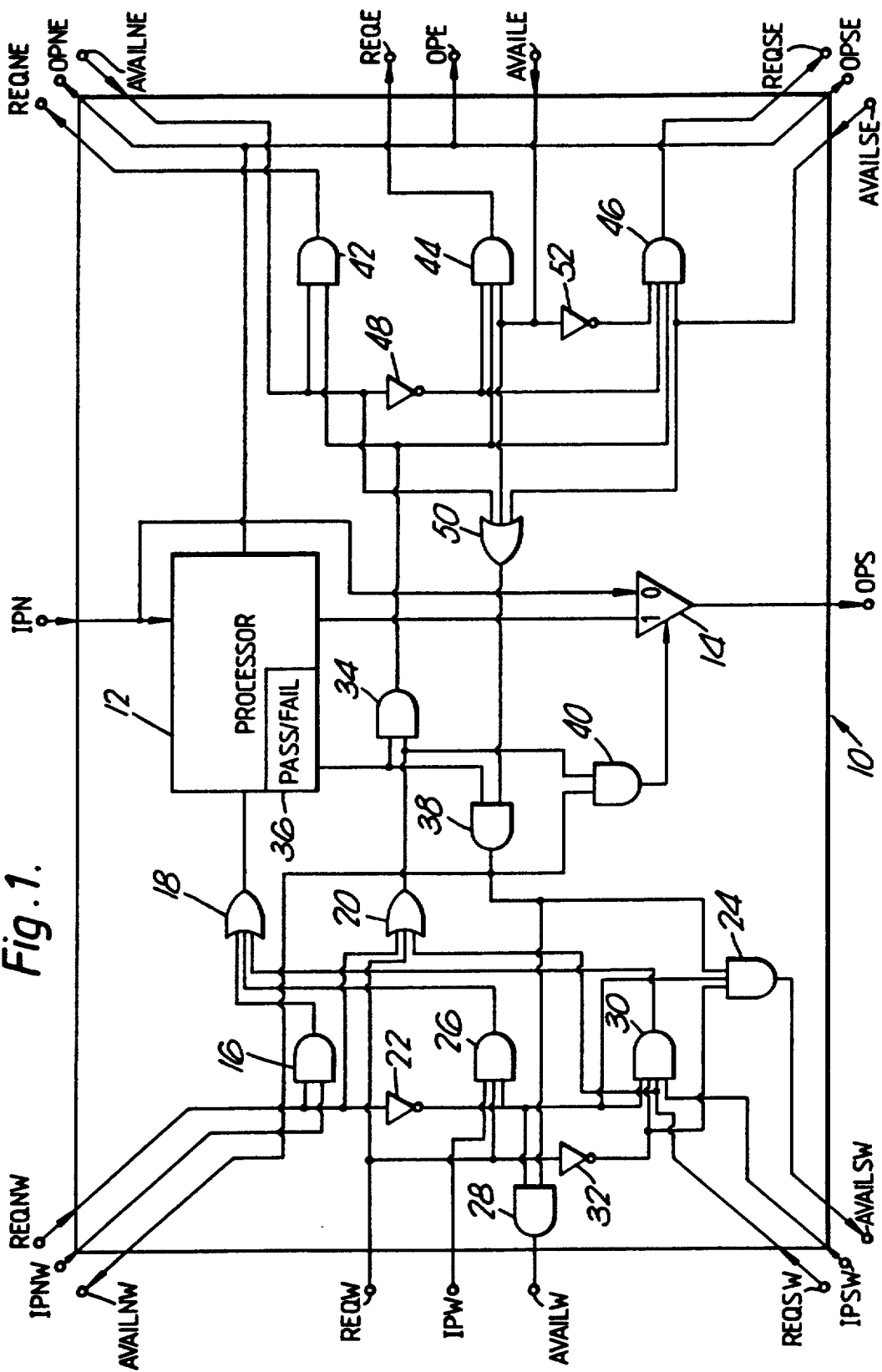
FIG. 1 shows a processing cell of the invention.

Referring to FIG. 1, there is shown a processing cell 10 of the invention. The cell 10 has twenty input/output terminals having references with a prefix IP, OP, REQ, or AVAIL and a suffix N, S, E, W, NE, NW, SE or SW. The prefixes represent input, output, request and available respectively, and the suffixes are points of the compass indicating the relevant location. "AVAILNE" for example represent "available North East". This reference scheme assists circuit analysis, as will be described.

Terminal IPN is connected to a processor 12 and a 0-selected input of a two-input multiplexer 14. The output of multiplexer 14 is connected to OPS terminal. IPNW and REQNW terminals are connected to the two inputs of an AND gate 16, the output of this gate providing one input to a three-input OR gate 18. The processor 12 receives the output of OR gate 18. REQNW terminal is also connected directly as input to a three-input OR gate 20, and via an inverter 22 as input to three-input AND gates 24 and 26 and two- and four-input AND gates 28 and 30.

REQW terminal is connected directly as input to OR gate 20 and AND gate 26, and via an inverter 32 as input to AND gates 24 and 30. IPW terminal provides a third input to AND gate 26. REQSW and IPSW terminals provide third and fourth inputs to AND gate 30, and the former also provides a third input to OR gate 20. The outputs of AND gates 26 and 30 provide second and third inputs to OR gate 18.

The output of OR gate 20 is connected to one input of a two-input AND gate 34, which receives a second input from a PASS/FAIL section 36 of processor 12. The section 36 furnishes a 0 output if processor 12 is faulty and 1 otherwise. It is also connected to an AND gate 38 providing output to the AVAILNW terminal, to the third input of AND gate 24, to the second input of AND gate 28 and to a first input of a further AND gate 40. OR gate 20 output provides a second input to AND gate 40, whose output controls input line selection by multiplexer 14 for subsequent output. AVAILSW and AVAILW terminals are connected to the outputs of AND gates 24 and 28 respectively.

AND gate 34 output provides first inputs to two-, three- and four-input AND gates 42, 44 and 46. AVAILNE terminal is connected to a second input of AND gate 42, to an inverter 48 providing inputs to AND gates 44 and 46, and to a first input of a three input OR gate 50. The output of OR gate 50 is connected to a second input of AND gate 38. AVAILE terminal is connected to a third input of AND gate 44, to a second input of OR gate 50, and to an inverter 52 providing a third input to AND gate 46. AVAILSE terminal is connected to a fourth input of AND gate 46 and to a third input of OR gate 50. REQNE, REQE and REQSE terminals are connected to the outputs of AND gates 42, 44 and 46 respectively. OPNE, OPE and OPSE are connected directly to processor 12.

Operation of the processing cell 10 will be analysed hereinafter with reference to FIGS. 2 and 3, which will now be described. These drawings respectively show rectangular arrays 60 and 62 of processors such as 64 and 64' illustrated schematically as circles. The arrays 60 and 62 have northern and western inputs N and W, and southern and eastern outputs S and E. The array 60 has three rows and five columns of processors such as 64 these having North, South, East and West (N, S, E and W) nearest-neighbour interconnections as indicated by lines such as 66. Array 62 has four rows and five columns of processors 64', some of which are faulty as indicated by crosses thereon such as $64'_x$, Some processor interconnections such as 68 are in the N, S, E or W directions, but there are also bypass connections such as 70 around faulty or unwanted cells. In addition, there are oblique or SE/NW and NE/SW interconnections 72 and 74.

Array 60 represents an array of perfect or fully operational cells arranged in combination to carry out a digital signal processing operation. It corresponds to a manufacturing procedure in which all faulty devices are discarded, resulting in unacceptably low yields. In fact, as processor complexity and array size increases yields rapidly become effectively zero. This is a major problem facing the development of wafer-scale integrated circuits in particular.

Compared to array 60, array 62 has an extra row of cells 64'. This enables faulty and unwanted cells to be bypassed as indicated at 70. Those cells in the array 62 which have connections to neighbours can be seen to form a three by five array functionally equivalent to array 60.

Referring now also to FIG. 1 once more, the cell 10 is designed to form an array building block, so that reconfigured arrays can be formed equivalent to perfect arrays. Each cell 10 is arranged to communicate with one eastern and one western neighbour selected from up to three of each which would be present in an array of cells 10. Such an array would be reconfigurable as indicated in FIG. 3 to bypass faulty and unwanted cells.

The cell 10 receives up to three request signals (REQNW, REQW and REQSW) from western neighbours, and up to three availability signals (AVAILNE, AVAILE and AVAILSE) from eastern neighbours. It provides a request signal (REQNE, REQE or REQSE) to one of three eastern neighbours, and receives up to three availability signals from western neighbours. The cell 10 must only output a true (logic 1) availability signal if it has a fault-free processor 12, and at least one of its eastern neighbours is outputting a true availability signal to it. If this is satisfied, a priority system is implemented by the cell 10 to decide in which western direction the cell itself will output a true availability signal. The priority system is set out in Table 1 below, in which true, false and X respectively represent logic 1, 0 and either 1 or 0 (true or false) arbitrarily.

TABLE 1

| Request Input Received by Cell from West | | | Availability Output generated by Cell to West | | |
|---|---|---|---|---|---|
| REQNW | REQW | REQSW | AVAILNW | AVAILW | AVAILSW |
| True | X | X | True | False | False |
| False | True | X | True | True | False |
| False | False | True | True | True | True |
| False | False | False | True | True | True |

The Table 1 scheme establishes a hierarchy of NW, W and SW in descending order of priority as regards availability for connection of the cell 10 thereto. The cell must be available for connection to an NW neighbour on receipt of a true REQNW signal, irrespective of W and SW request signals. It must be available for connection to a W neighbour in response to a request therefrom, provided that no NW true request is received and irrespective of any REQSW signal. It must be available to an SW neighbour in the event that both REQNW and REQW are false. The cell 10 should also remain available to all three neighbours when all request inputs are false. This corresponds to an idle state of the cell, and is not mandatory. It does however mean that the cell is available to replace a previously connected adjacent cell in the same column which has failed in service. Moreover, even when connected, a cell remains available to a more northerly western neighbour; i.e., the descending order of connection priority still applies. This continuing availability provides for the array to be reconfigured from the top down in the event of inservice cell failure.

The cell 10 implements as follows the Table 1 priority scheme and the requirement that any availability is conditional on a fault-free processor 10 combined with receipt of a true availability signal from an eastern neighbour. OR gate 50 receives input of all three eastern availability signals AVAILNE, AVAILE and AVAILSE. If any of these is true, OR gate 50 outputs 1 to AND gate 38, which in turn outputs 1 provided that PASS/FAIL section 36 of processor 12 outputs 1 indicating a fault-free state. The output of AND gate 38 appears directly at AVAILNW terminal, and is fed to AND gates 28 and 24 providing AVAILW and AVAILSW. If AND gate 38 output is true, AVAILNW is true irrespective of all input request signals; moreover, AVAILW is true irrespective of REQSW provided that REQNW is false, since in this event AND gate 28 receives 1 inputs from both AND gate 38 and inverter 22; finally, AVAILSW is true provided that REQNW and REQW are false, since AND gate 24 then receives 1 inputs from inverters 22 and 32 and AND gate 38. If all western request inputs are false, all western availability outputs are true.

The cell 10 is actually implemented, as opposed to being available, only if it receives a request signal from the west. Western input to processor 12 is via OR gate 18, which receives input from AND gates 16, 26 and 30.

A 1 or true signal from REQNW terminal provides a 1 input to AND gate 16, but 0 inputs to AND gates 26 and 30. OR gate 18 accordingly receives 0 inputs from AND gates 36 and 30 irrespective of the IPW, REQW, IPSW and REQSW signals. The output of AND gate 16, and so also that of OR gate 18 to processor 12, will be 0 or 1 in accordance with signal IPNW being 0 or 1. This effectively inputs IPNW to processor 12. If REQNW is 0, inverter 22 supplies a 1 input to AND gates 26 and 30. If REQW is 1, AND gate 26 receives a second 1 input but inverter 32 provides a 0 to AND gate 30. OR gate 18 accordingly receives 0 inputs from AND gates 16 and 30, and 0 or 1 from AND gate 26 according to 0 or 1 IPW signals. This effectively inputs IPW to processor 12.

Finally, if REQNW and REQW terminal input signals are 0, inverters 22 and 32 provide respective 1 inputs to AND gate 30. A third 1 input is received by this gate if REQSW is true; its output to OR gate 18 and thence to processor 12 will be 0 or 1 according 0 or 1 at its fourth input from IPSW terminal. This demonstrates that the input to processor 12 from the west is provided via IPNW, IPW or IPSW in descending order of priority as prescribed by corresponding request signals.

Request signals are generated by (as opposed to input to) the cell 10 for output to eastern neighbours in accordance with a different scheme. The cell must only output a true request signal if processor 12 is fault-free and at least one western neighbour provides a true input request signal. If this condition is satisfied, the cell outputs a single true request to the east in accordance with the priority scheme of Table 2 below, which incorporates Table 1 nomenclature.

TABLE 2

| Availability Input from East | | | Request Output from Cell to East | | |
|---|---|---|---|---|---|
| AVAILNE | AVAILE | AVAILSE | REQNE | REQE | REQSE |
| True | X | X | True | False | False |
| False | True | X | False | True | False |
| False | False | True | False | False | True |
| False | False | False | False | False | False |

It will be seen that an AVAILNE input signal produces a REQNE output irrespective of availability inputs from E or SE. When AVAILNE is false, a true AVAILE produces a true REQE irrespective of AVAILSE. When both AVAILNE and AVAILE are false, an AVAILSE true signal produces a true REQSE. Finally, when all input availability signals are false, all output request signals are false. This establishes NE, E and SE in descending order of priority for connection to the cell. The hierarchical structure is similar to that for connection to western neighbours.

The cell 10 implements as follows the Table 2 priority scheme and the requirement that processor 12 be fault-free combined with receipt of a true western request signal. OR gate 20 receives all three western availability signals. If any of these is true, OR gate 20 outputs 1 to AND gate 34, which in turn outputs 0 or 1 to AND gates 42, 44 and 46 according to whether or not processor 12 is faulty. Accordingly, all eastern request outputs are 0 or false if there is no western neighbour available or processor 12 is faulty. If AND gate 34 output is 1 the following applies. AND gate 42 receives AVAILNE directly, whereas AND gates 44 and 46 receive it after inversion at 48. A true AVAILNE accordingly provides for 1, 0 and 0 to be input to AND gates 42, 44 and 46 respectively. AND gates 44 and 46 then output 0 or false to REQE and REQSE terminals, whereas AND gate 42 provides a true output to REQNE terminal. If AVAILNE is false, AND gates 44 and 46 receive 1 inputs from inverter 48 together with 1 inputs from AND gate 34.

If AVAILE is true, AND gate 44 receives all true inputs and provides a true output at REQE terminal. A true AVAILE signal is however inverted at 52, which provides a false signal input to AND gate 46 and consequent false output at REQSE terminal. If AVAILNE and AVAILE signals are both false but AVAILSE is true, AND gate 46 receives all true inputs and provides a true REQSE output. If all three eastern availability signals are false, all eastern request signals are false.

The foregoing analysis assumes that the cell 10 has three neighbours to east and west. This is not the case for cells at array edges. Unconnected REQ and AVAIL inputs at NE, SE, NW or SW are preset to false, whereas those at E or W are set to true. IPN, OPS, IPE or IPW terminals at array edges will have or lack connections in accordance with array function.

Finally, the combination of AND gate 40 and multiplexer 14 provides for the processor 12 to be implemented or bypassed according to whether or not the cell 10 is both east-west connectable and the processor 12 is fault-free. AND gate 40 receives inputs from OR gate 20 and AND gate 38, both being true if there are east and west neighbours generating true availability and request signals respectively and processor 12 is fault-free. AND gate 40 output is then 1, and multiplexer 14 routes its 1-selected input or processor 12 output signal to OPS terminal. If AND gate 40 output is 0, multiplexer 14 connects IPN through to OPS bypassing processor 12.

From the foregoing analysis, it will be apparent that the cell 10 will be operationally connected both east-west and north-south provided that:
(1) it has a fault-free processor, and
(2) it has both western and eastern neighbours operationally available.

Whereas the cell 10 has inputs and outputs arranged for bit-serial signals, adaptation to deal with bit-parallel signals is straight-forward. For example, if IPW consisted of n terminals for connection to an n-bit bus, n AND gates 26 could be employed in parallel to provide one gate per input bit. Similar arrangements would be required at other non-REQ western inputs, and multiplexer 14 would be replicated. Outputs other than REQ or AVAIL would only require buses to replace one-bit lines.

Figure 2:
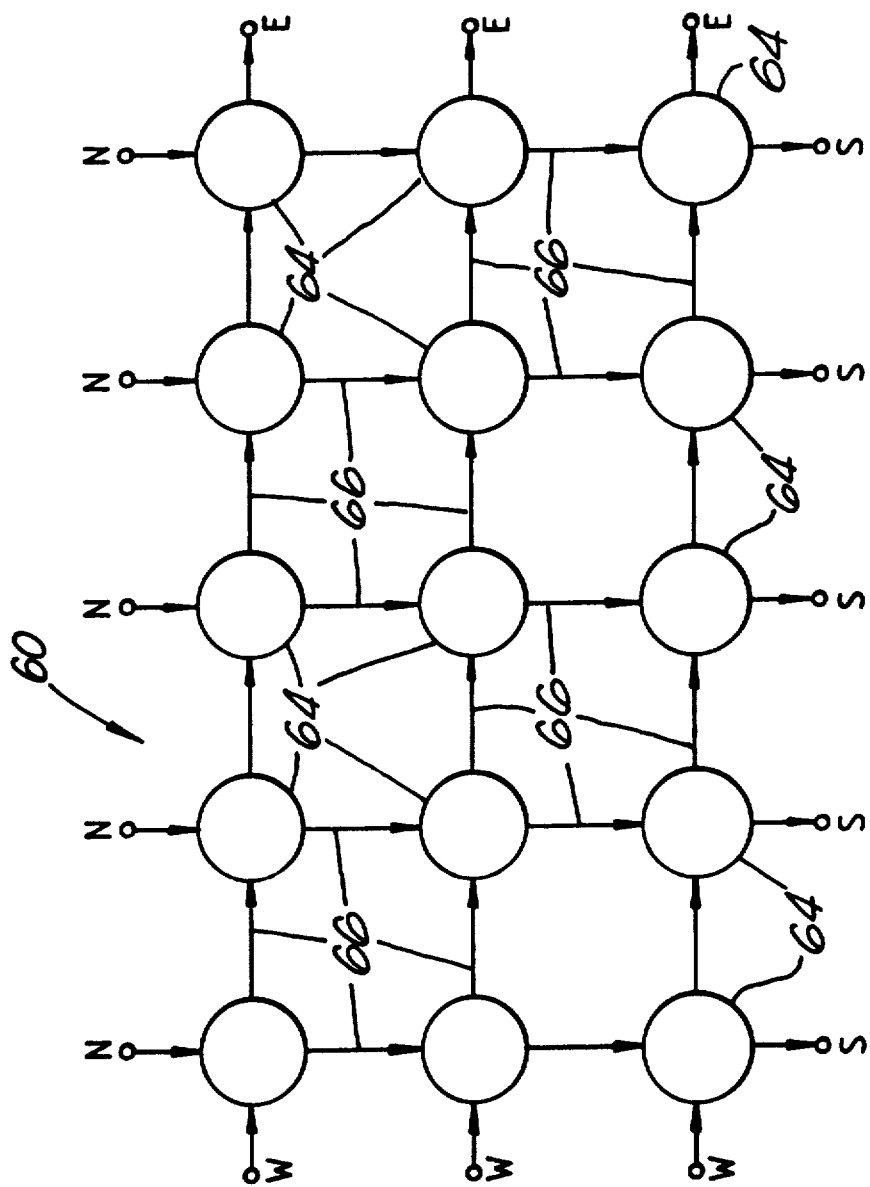
FIGS. 2 and 3 respectively illustrate schematically fully and partly operational arrays of processing cells, the latter being functionally equivalent to the former.
Figure 3:
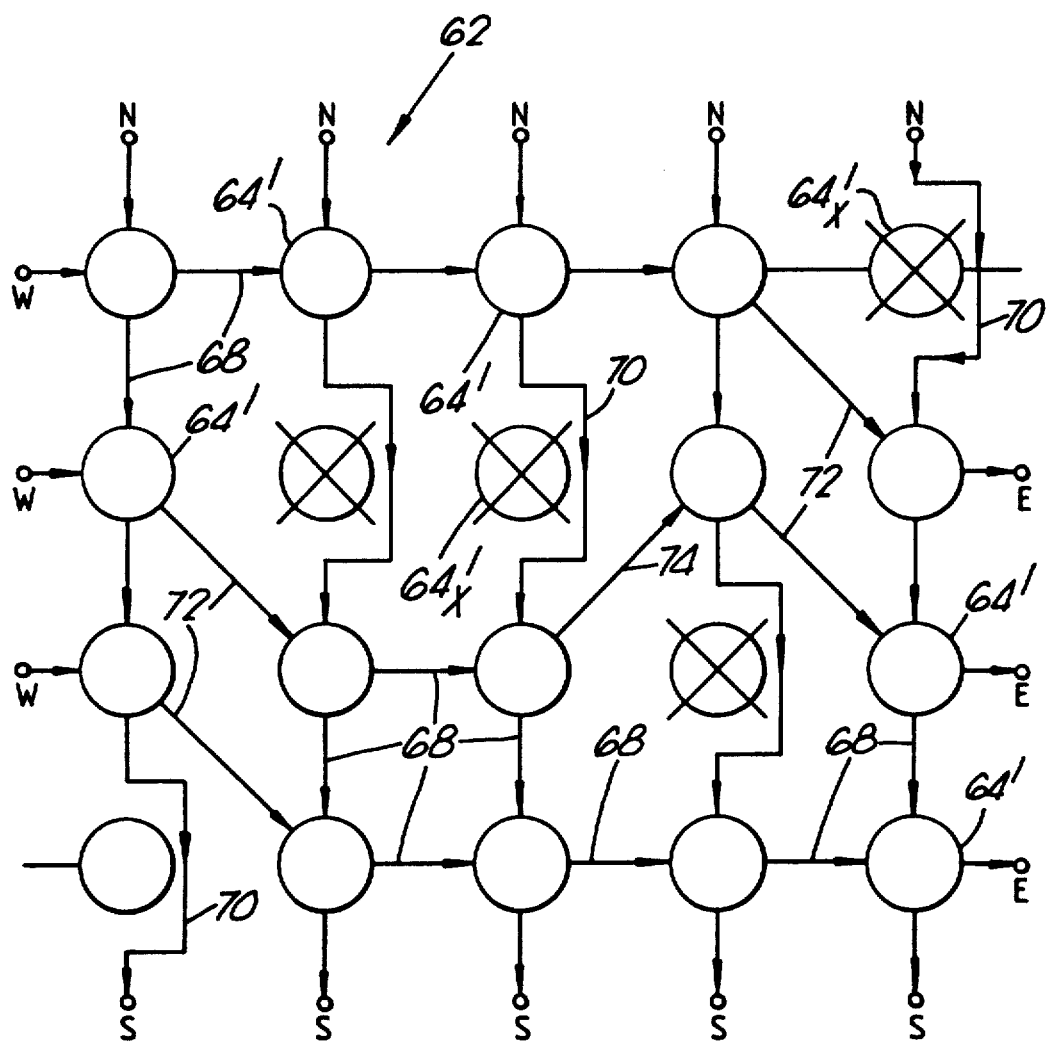

Referring to FIGS. 2 and 3 once more, an extra row of cells was provided for array reconfiguration. More generally, the degree of fault tolerance of an array will depend on both the array size and the number of additional rows. Greater array size will increase the chance of a faulty cell in any row, and a greater number of additional rows will improve fault tolerance. Against the latter, the larger the number of additional rows the greater becomes the expense of production and consumption of available semiconductor wafer area. There will be a trade-off between yield improvement due to fault tolerance and its reduction due to fewer integrated circuits per wafer because of increased circuit area. The optimum may be determined in any particular case by known statistical techniques.

The invention has been described in terms of a cell 10 connectable to N, S, E and W neighbours to form part of the functional equivalent of a rectangular array. However, it may also form part of a linear array in which only East-West connections are required. In this case it is unnecessary to provide IPN and OPS terminals, AND gate 40 and multiplexer 14. Such a cell may then be arranged in a three row array from which a single functional row would be obtainable. For lower but still some fault tolerance, the cell could be part of a two row array. In this case it would not be necessary to arrange for a priority scheme to govern cell connection, since only selection between one of two alternatives would be required to avoid connection of both alternatives. A priority scheme would however both implement this and provide for use of a previously idle cell in the event of in-service cell failure.

The foregoing description has not discussed the form of self testing arrangements incorporated in processor 12 in the cell 10. This is because such arrangements are known in the art, as described for example by D Komonytsky in "LSI Self Test using LSSD and Signature Analysis, IEEE Test Conference 1982. The processor itself may be a microprocessor, a transputer or part of a distributed array processor. The form of processor 12 may of course differ between different cells 10 in an array.

An array of cells 10 configured in accordance with FIG. 3 provides three functional rows out of four. Column inputs and outputs to N and from S respectively remain fixed, since the number of columns in the array does not change. However, row input and output connections to W and from E respectively are not predetermined. These will vary from array to array depending on which rows are operational. Moreover, they may change during array operation if a processor 12 fails in service, and the array is reconfigured as a result. From the previous description, it will be apparent that a fully operational row will always begin with a west array edge cell which has a true AVAILW output. Input to such a cell may therefore be made to the cell's IPW terminal. Furthermore, any cell at the end of a fully operational row provides a true REQE output. An array user may accordingly determine operational row inputs and outputs by detecting AVAILW and REQE at respective edge cells. It will be apparent from FIG. 3 that the nth functional row begins and ends with respective cells indicating the nth true AVAILW and REQE, where n=1, 2 or 3. Input connections and associated array state determining circuitry may be arranged to facilitate operational row determination by means well known in the art.

For some purposes it may be convenient to provide for input to and output from operational array rows to be automatic. This will now be described with reference to FIGS. 4 to 7, in which input/output terminals corresponding to those in FIG. 1 are like-referenced.

Figure 4:
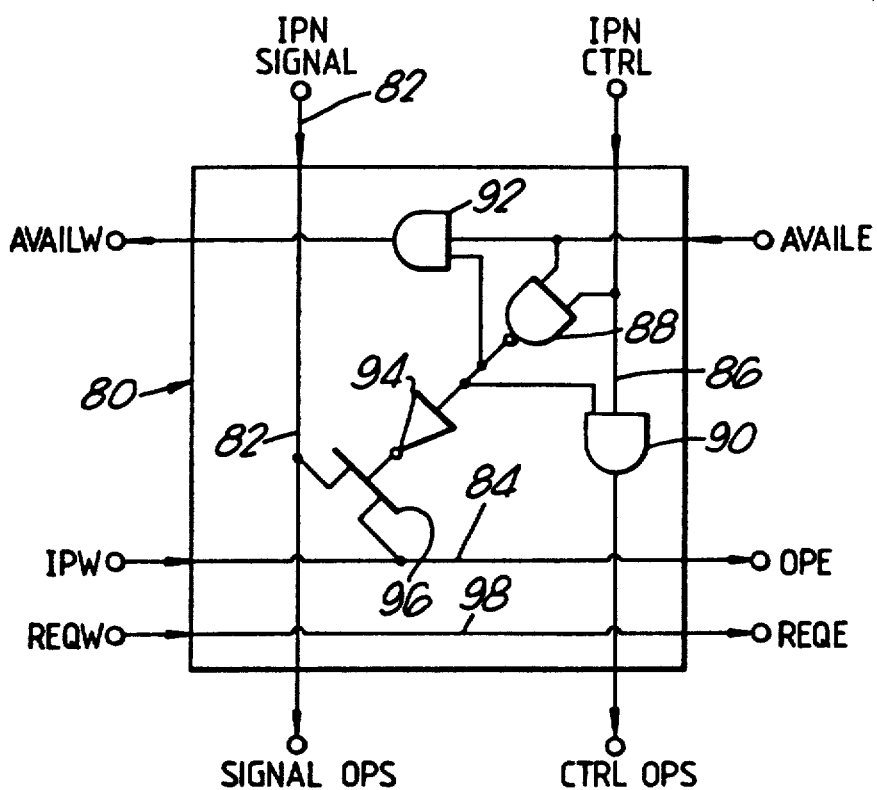
FIG. 4 shows an input cell for use in providing inputs to an array of processing cells of the invention.

Referring to FIG. 4, there is shown an input cell 80 for forming an input array as will be described. The input cell 80 has a NS line 82 connecting IPN and OPS signal terminals, and an EW line 84 connecting IPW and OPE signal terminals. An IPN control (CTRL) input is connected by an NS CTRL line 86 as input to a NAND gate 88 and an AND gate 90. The output of AND gate 90 is fed to an OPS CTRL output. An AVAILE input is connected both to NAND gate 88 and to a second AND gate 92, the output of the latter being fed to an AVAILW output. NAND gate 88 output is fed as a respective second input to each of AND gates 90 and 92. This output is also inverted at 94 and used to control a transistor switch 96 connected between lines 82 and 84. REQW and REQE terminals are connected directly together by an EW line 98.

The cell 80 operates as follows. If it receives true AVAILE and IPN CTRL signals, NAND gate 88 produces a 0 output. This is inverted to 1 by inverter 94, and switch 96 is switched on connecting IPN to OPE via lines 82 and 84. Moreover, AND gates 90 and 92 receive NAND gate 88's 0 output, and produce 0 outputs at CTRL OPS and AVAILW. If either AVAILE or IPN CTRL receives 0, IPN is not connected to REQE and AND gates 90 and 92 receive 1 from NAND gate 88. AVAILW then becomes 0 or 1 according to whether AVAILE is 0 or 1, and CTRL OPS becomes 0 or 1 according to whether IPN CTRL is 0 or 1. The function of REQW and REQE will be described later.

Referring now also to FIG. 5, there is shown an input array 100 of three columns and four rows of input cells 80. Features equivalent to those described with reference to FIG. 4 are like referenced with indices i and j ($i=0$ to 2, $j=0$ to 3) indicating column and row positions respectively. Features not specifically referred to are unreferenced and undrawn to avoid unnecessary figure complexity. Each input cell 80 has inputs and outputs connected to neighbouring cells (where available) as shown. East column cells $80_{20}$ to $80_{23}$ have AVAILE, OPE and REQE terminals for connection to the western edge terminals of five column, four row array of cells 10 (not shown), as described with reference to FIGS. 1 and 3. REQW$_{00}$ terminal receives a permanent 1 or true input signal, as do all top row CTRL terminals IPN$_{00}$ to IPN$_{20}$. CTRL OPS$_{00}$ is connected to REQW$_{01}$ by a line $102_0$, and similarly lines $102_1$ and $102_2$ connect CTRL OPS$_{01}$ and CTRL OPS$_{02}$ to and REQW$_{03}$ respectively. Bottom row cell SIGNAL OPS terminals are all unconnected, but the corresponding CTRL OPS terminals are all connected as inputs to a three input NOR gate 104.

The array 100 operates as follows. IPN$_{00}$ to IPN$_{20}$ terminals provide three signal inputs for three operational rows of a four row array of cells 10, some of which are faulty as shown in FIG. 3. Input is to be made to IPW terminals of cells 10 of a western edge array column provided that each cell begins an operational row. Consider cell $80_{20}$. Since IPN$_{20}$ CTRL is 1, and REQE$_{20}$ is 1 because REQE$_{00}$ is 1, IPN$_{20}$ is connected or unconnected to the adjacent array (not shown) via OPE$_{20}$ according to whether AVAILE$_{20}$ is 1 or 0 indicating an operational row of cells 10. This follows directly from the function of cells 80 as previously described. If IPN$_{20}$ becomes connected, CTRL OPS$_{20}$ receives 0 from AND gate $90_{20}$ (see FIG. 4); this signal passes through cells $80_{21}$, $80_{22}$ and $80_{23}$ as successive CTRL input and output signals before reaching CTRL OPS$_{23}$ and NOR gate 104. This ensures that IPN$_{20}$ cannot subsequently be connected to any of OPE$_{21}$ to OPE$_{23}$ after connection to OPE$_{20}$. Connection of IPN$_{20}$ to OPE$_{20}$ is accompanied by a 0 appearing at AVAILW$_{20}$, and consequently at AVAILE$_{10}$ and AVAILE$_{00}$ also. This ensures that IPN$_{10}$ is not connected to OPE$_{10}$ and thence to OPE$_{20}$. IPN$_{10}$ signals pass to cell $80_{11}$, which also receives a 1 from CTRL OPS$_{10}$ indicating non-connection of IPN$_{10}$ to OPE$_{10}$. If AVAILE$_{21}$ is 1, then since its CTRL input signal is 0 cell $80_{21}$ provides an AVAILW output signal of 1. This becomes the AVAILE input signal to cell $80_{11}$, which responds by connecting its IPN$_{11}$ to OPE$_{11}$. A through connection is accordingly provided from IPN$_{10}$ to OPE$_{21}$ via IPN$_{11}$ and OPE$_{11}$ of cell $80_{11}$. In addition, 0 CTRL signals pass to cells $80_{12}$ and $80_{13}$ for output at CTRL OPS$_{13}$, and a 0 AVAIL signal passes to cell $80_{01}$. IPN$_{10}$ accordingly cannot subsequently become connected to OPE$_{22}$ or OPE$_{23}$. Since AVAILE$_{00}$ is 0 as previously said, CTRL$_{00}$ is 1 and so also is REQW$_{01}$ connected thereto. Connection of IPN$_{10}$ to OPE$_{21}$ is therefore accompanied by a true REQ$_{21}$ output signal, ensuring connection of OPE$_{21}$ to an operational row of the adjacent array (not shown) to the east of array 100.

A similar analysis to that foregoing would demonstrate that a true signal at AVAILE$_{22}$ results in connection of IPN$_{00}$ to OPE$_{22}$ via cells $80_{01}$, $80_{02}$ and $80_{12}$. This is accompanied by a CTRL OPS$_{03}$ of 0 and a REQE$_{22}$ of 1. Since all three bottom row OPS signals are 0, NOR gate 104 produces a 1 output indicating that the array of cells 10 (not shown) is operational. Consider now the case of any one of AVAIL$_{20}$ to AVAIL$_{22}$ being originally or subsequently becoming 0, say AVAIL$_{2j}$ ($j=0$, 1 or 2). The corresponding IPN$_{(2-j)0}$ terminal is connected via OPE$_{2(j+1)}$ one row lower down array 100. Similarly, any IPN terminals to the west of IPN$_{(2-j)0}$ become connected one row lower than previously described. This follows directly from the previous analysis.

If any two or more of AVAILE$_{20}$ to AVAIL$_{23}$ receive 0 or indications of operational row unavailability, there are then not enough rows to allow connection of all three signal inputs IPN$_{00}$ to IPN$_{20}$. Under these circumstances, CTRL OPS$_{03}$ (at least) receives a 1 signal indicating that an EW line 98 is still being sought. The output from NOR gate 104 accordingly is 0, indicating an array of cells 10 which is non-operational since it has insufficient rows available.

Figure 6:
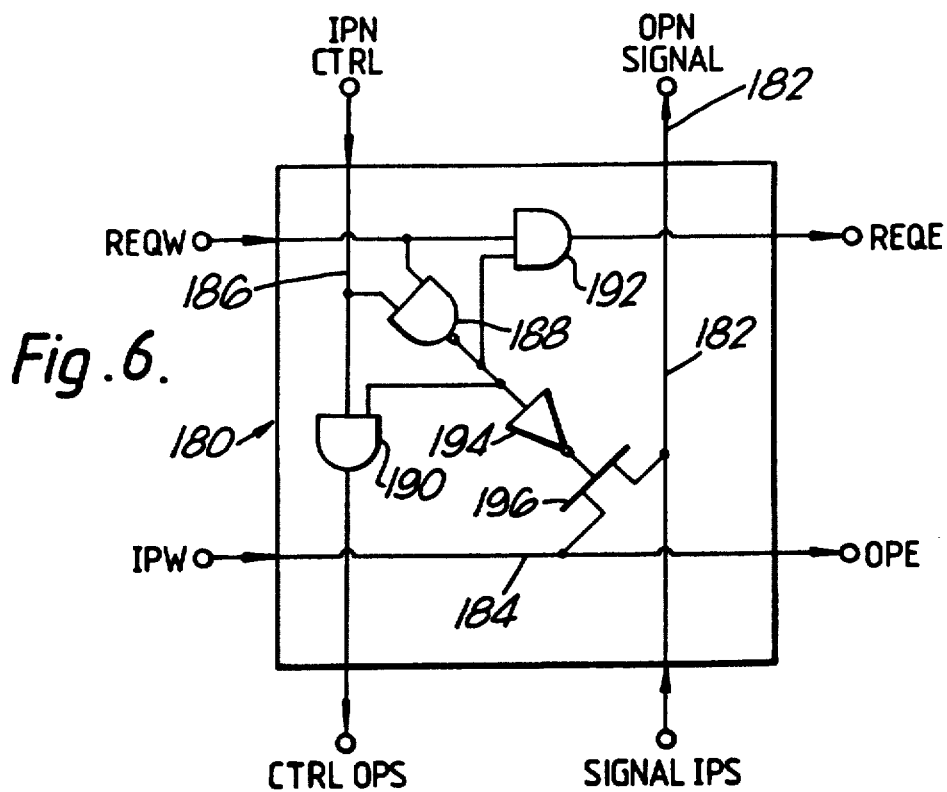
FIG. 6 shows an output cell for use in providing outputs from an array of processing cells of the invention.

Referring now to FIG. 6, there is shown an output cell 180 similar to input cell 80, but arranged to reconfigure outputs from an array of cells 10 in accordance with operational row availability. The output cell 180 is virtually a mirror image or lateral inversion of cell 80; for this reason equivalent features are like-referenced with the prefix 100. The differences are that: (1) there is no equivalent of REQW-REQE line 98; (2) REQW terminal is connected to AND gate 192 and thence to REQE terminal, rather than the AVAILE-AND gate 92-AVAILW connection; and (3) signals pass from terminals IPW or IPS to OPN SIGNAL terminal upwardly, rather than downwardly as before.

The operation of output cell 180 is analogous to that of input cell 80. IPN CTRL and REQW signals which are both 1 result in transistor switch 196 connecting IPW to line 182 between IPN and OPS signal terminals. If either of these two signals is 0, both REQE and CTRL OPS terminals receive 0. Since operation is very similar to that set out with reference to FIG. 4, a detailed analysis will not be given.

Figure 7:
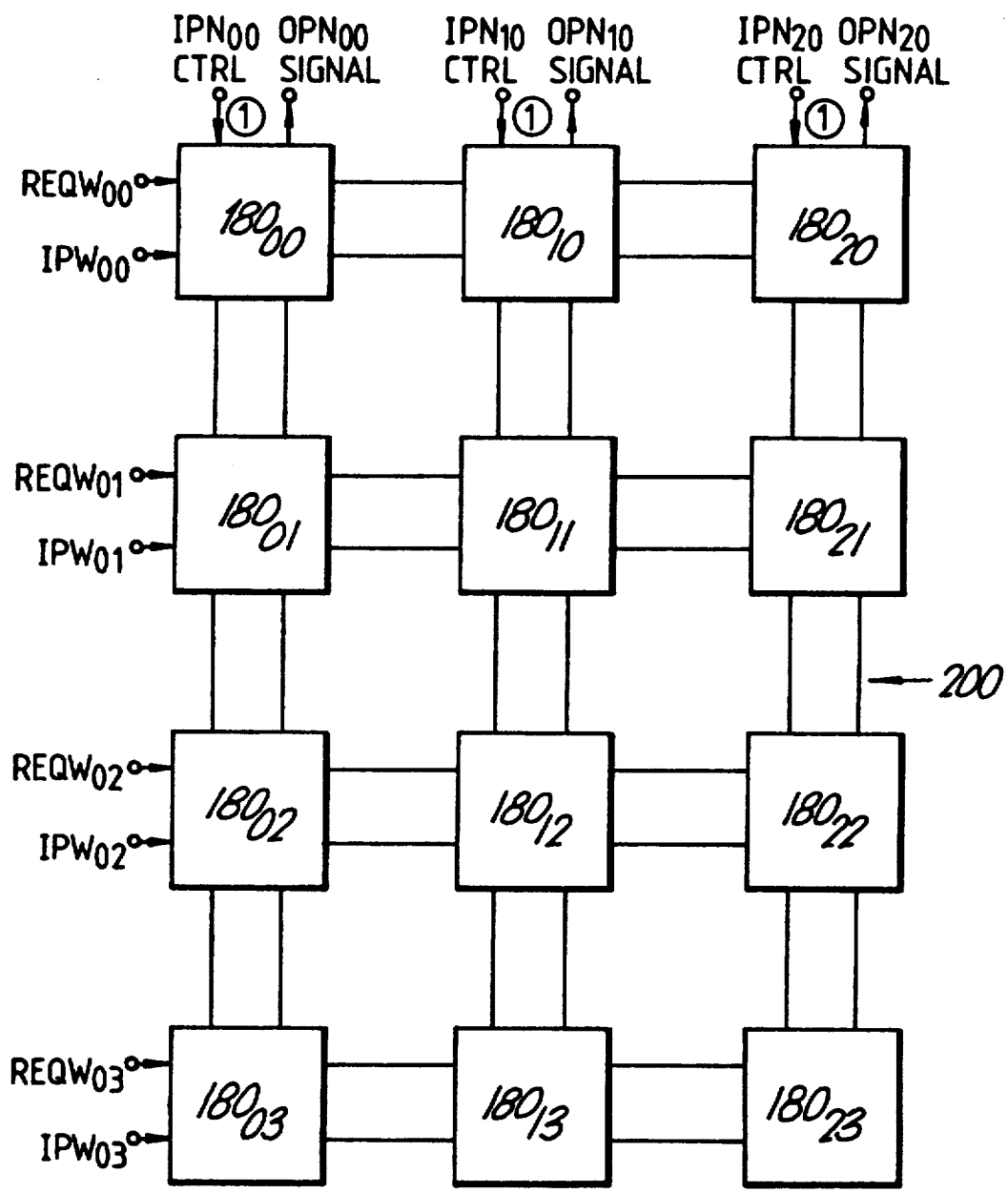
FIG. 7 schematically shows an array of FIG. 6 cells.

Referring now also to FIG. 7, there is shown an output array 200 of three columns and four rows of output cells 180. Features equivalent to those shown in FIG. 6 are like-referenced with indices i and j (i=0 to 2, j=0 to 3) indicating column and row positions respectively. Features not specifically referred to are unreferenced and undrawn to avoid unnecessary figure complexity. Each output cell 180 has respective inputs and outputs connected to its N, S, E and W neighbours (where available) as appropriate. Each west or left-hand column cell $180_{0j}$ has respective $REQW_{0j}$ and $IPW_{0j}$ terminals connected to respective $REQE_{0j}$ and $OPE_{0j}$ terminals of a cell 10 in an extreme right-hand or east column of an array of cells 10 (not shown); i.e., the output array 200 receives the output of an array of cells 10 equivalent to array 62 of FIG. 3.

Control signals permanently set to 1 are applied to top row $IPN_{i0}$ CTRL terminals. By an analysis similar to that given with reference to FIGS. 4 and 5, it can be shown that any $IPW_{0j}$ terminal to a left hand column cell $180_{0j}$ becomes connected to a respective $OPN_{j0}$ SIGNAL terminal provided that both it and any available cells $180_{0n}$ (n=0 to j−1) above it have true input signals at their REQW terminals. In other words, if $REQW_{00}$ to $REQW_{02}$ terminals all receive true input signals from the array of cells 10, connections $IPW_{00}$ - $OPN_{00}$ SIGNAL, $IPW_{01}$ - $OPN_{10}$ SIGNAL and $IPW_{02}$ - $OPN_{20}$ SIGNAL become established via cells $180_{00}$ - $180_{01}$ - $180_{11}$ - $180_{10}$ and $180_{02}$ - $180_{12}$ - $180_{22}$ - $180_{21}$ - $180_{20}$ respectively. $IPW_{03}$ is left unconnected to any OPN SIGNAL irrespective of the associated $REQW_{03}$ terminal input signal.

If however $REQW_{00}$ terminal receives a false input signal, $IPW_{00}$ is not connected to $OPN_{00}$ or any other top row cell output. If in addition to $REQW_{03}$ terminals receive true input signals, $IPW_{01}$ to $IPW_{03}$ become connected to $OPN_{00}$ to $OPN_{02}$ respectively via cells $180_{01}$ - $180_{00}$, $180_{02}$ - $180_{12}$ - $180_{11}$ - $180_{10}$ and $180_{03}$ - $180_{13}$ - $180_{23}$ - $180_{22}$ - $180_{21}$ - $180_{20}$. This analysis extends naturally so that for one false REQW input signal, $OPN_{00}$ to $OPN_{02}$ become connected to the remaining three of $IPW_{00}$ to $IPW_{03}$ associated with respective true REQW input signals.

If two or more of $REQW_{00}$ to $REQW_{03}$ terminals receive false input signals, there are fewer operational rows of cells 10 (not shown) available than are required for connection of $OPN_{00}$ to $OPN_{20}$. In this case, NOR gate 104 in FIG. 5 would indicate a non-operational array of cells 10. It is also possible to NOR together the CTRL OPS terminals (not shown) of bottom row cells $180_{03}$ to $180_{23}$ to provide a functional state indication.

In the foregoing analyses of the operation of arrays 100 and 200, control inputs (IPN) to top row cells 80 and 180 were uniformly initialised to 1. It is however possible to employ these inputs to provide array size programmability. Consider for example a processing array of cells 10 having m columns and n rows, m and n being arbitrary positive integers equal to at least 3 for most applications. The number of rows n defines the maximum number of inputs to and outputs from the processing array when all cells 10 are operational. Such an array might be a wafer-scale integrated circuit (IC) array of transputer processors 12 within cells 10 together with input and output arrays similar to arrays 100 and 200. Individual applications of the IC array might require k functional rows where $1 \leq k \leq n$. This is achievable for any value of k by furnishing a true CTRL input signal or 1 to the k top row input and output cells 80 and 180 adjacent to the array of cells 10. Other top row input and output cells which are more remote receive a 0 CTRL input. The IC array is then operational provided that it has k functional rows. The fault tolerance of the IC array necessarily diminishes as k increases, and is zero for k=n.

The foregoing description has not mentioned the possibility of faults within circuitry other than processor 12 in cell 10. Necessarily the additional circuitry will be prone to faults, and it might be considered that the fault tolerance advantages are nullified by the additional potential fault sources. However, in practice a processor 12 may have in the order of or more than $10^4$ gates. The additional gate count in a cell 10 is only about 20. (The gate count depends on how complex each circuit is, as well as how many circuits there are. Four-input AND gate 30 or 46 might be counted as two or more gates). Furthermore, input/output arrays such as 100/200 add only five gates per cell 80 and 180, treating inverters and transistor switches as gates. For the arrangement of input array 100—processing array 62—output array 200, the overhead is 520 gates. This is designed to achieve an operational processing array functionally equivalent to array 60 having fifteen operational processors 64, which would have a total number of gates in the order of $1.5 \times 10^5$. An array 62 would have in the order of $2 \times 10^5$ gates. The overhead of 520 gates represents only an extra 0.25% in $2 \times 10^5$ gates, and faults in these additional circuits can be ignored for practical purposes.

Referring once more to FIG. 3, the illustrated embodiment relates to an array 62 in which each row extends over the full array width. Fault tolerance is achieved in effect by reducing the number of array rows, with the number of columns remaining constant. The array 62 nay be considered as a full width, variable height array. It will be apparent that a variable width, full height array can be formed by rotating the array 62 through 90°. This produces a constant row, variable column array. In either case, the array is reconfigurable in one dimension only. For some purposes it may be desirable to form arrays which are reconfigurable in two dimensions.

Certain difficulties arise in providing a two dimensionally reconfigurable array in which each row and column should cross at a single processor site.

Figure 8:
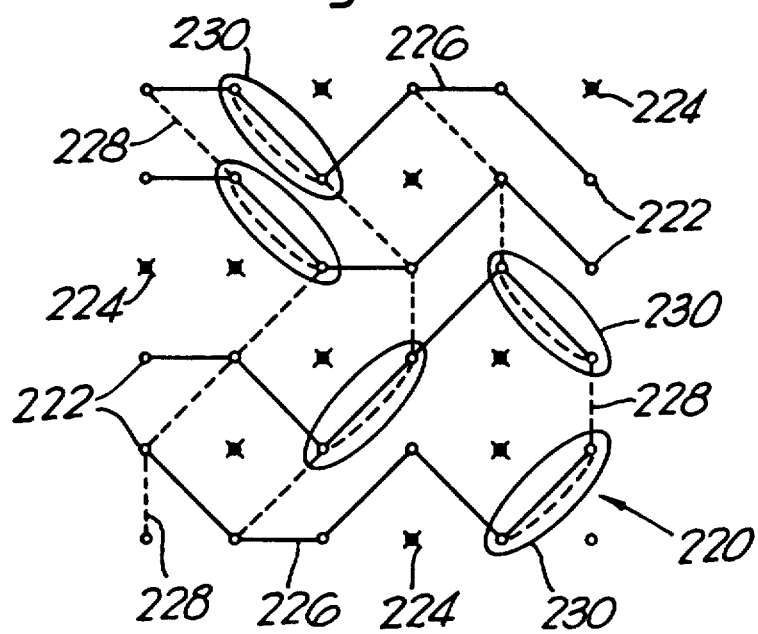
FIGS. 8 and 9 respectively illustrates the "double site" and "improper crossover" problems in two-dimensionally reconfigurable arrays.

Referring now to FIG. 8, there is illustrated what is herein referred to as the "double site" condition. An array 220 is shown comprising individual cells represented by circles such as 222. Cells not connected are indicated by overwritten crosses such as 224. Operational rows and columns are indicated by continuous and chain lines 226 and 228 respectively. As indicated within ellipses 230, there are several instances of an adjacent pair of cells occupying both the same respective row and column; i.e., a column contains two cells of a row (or vice versa), which conflicts with the array requirement that rows and columns should cross at single processor sites. This problem is avoided by arranging each cell to become bypassed in both row and column in the event that it is in a state requesting connection to an SE or SW neighbour for both row and column connection purposes. This bypasses the upper of a double site pair of cells, and is preferred. The lower could of course be bypassed by substituting NE/NW for SE/SW in the foregoing.

Figure 9:
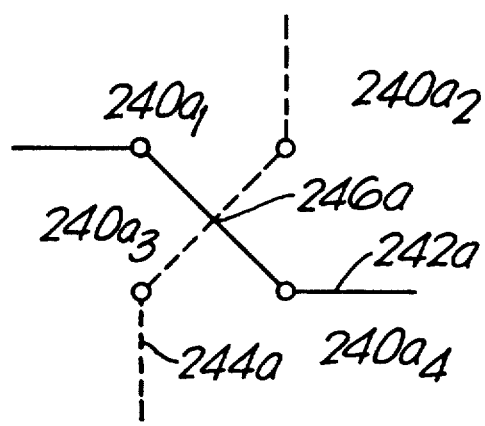
Figure 9:
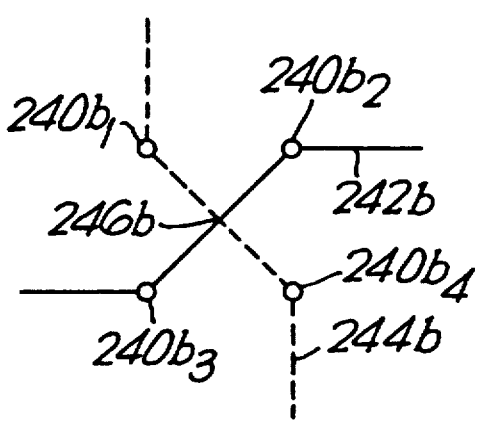

Referring now to FIG. 9(a) and 9(b), there is illustrated a further difficulty referred to herein as an improper crossover. Four cells $240a_1$ to $240a_4$ and $240b_1$ to $240b_4$ are shown with row connections 242a and 242b in solid lines and column connections 244a and 244b in chain lines. As indicated at 246a and 246b, improper crossovers occur because a row/column intersection does not occur at a cell site.

Figure 10:
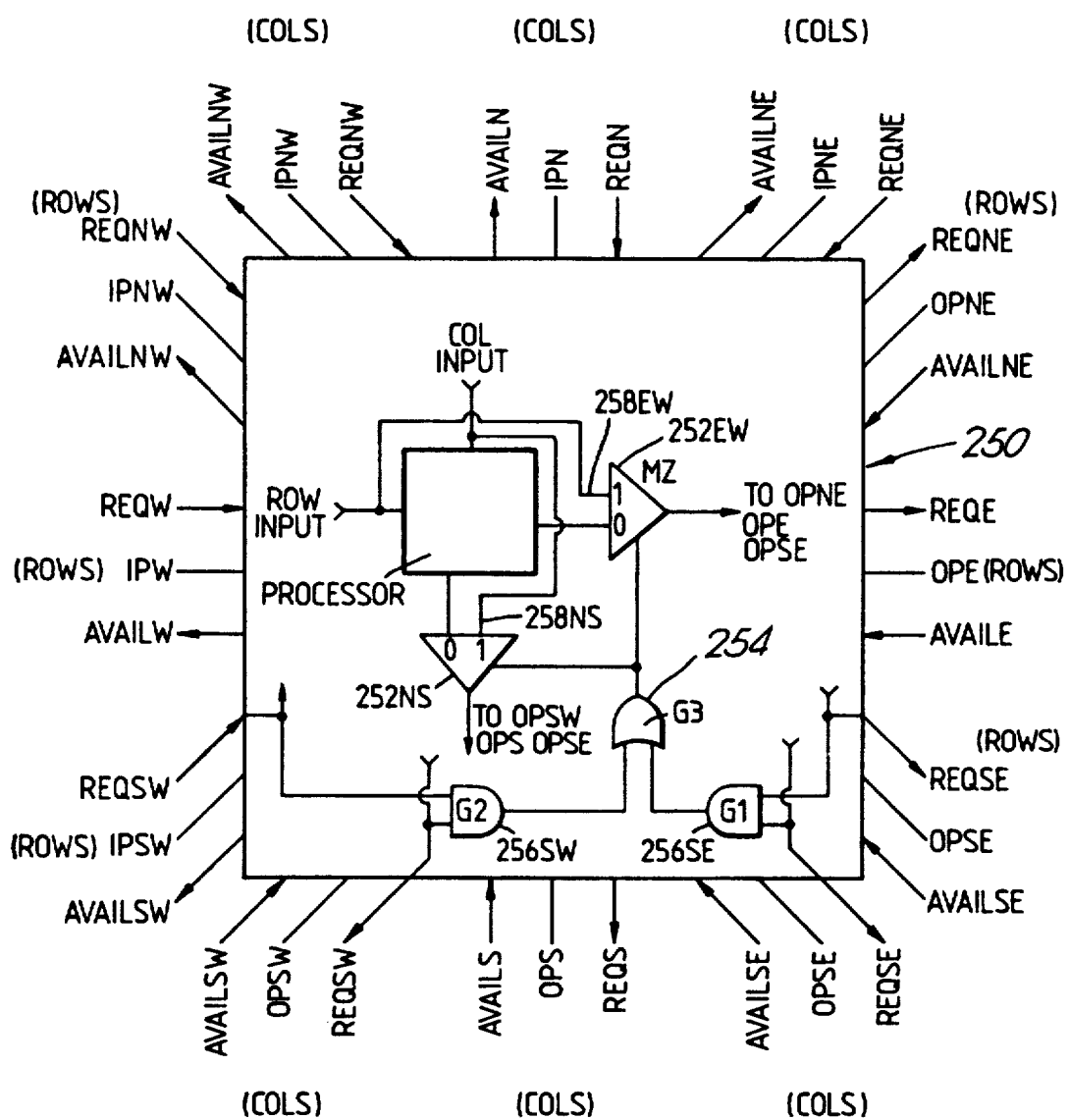
FIG. 10 shows a cell arranged for double site avoidance.

FIG. 10 shows a cell 250 of the invention with an interconnection scheme appropriate for connection as part of a two dimensionally reconfigurable array. The cell 250 is equivalent to a combination of two cells 10 (FIG. 1) with a 90° relative rotation; however, the two equivalents of AND gate 40 controlling processor implement/bypass multiplexer 14 are omitted. In FIG. 10, only that circuitry differing from the combination of two cells 10 will be described, since in all other respects it operates precisely in row and column reconfiguration as cell 10 does for row reconfiguration.

The cell 250 has as illustrated twice the number of input/output connections and twice the internal circuitry (not shown) as the cell 10, apart from omitted AND gate 40. It accordingly provides for request, availability and input/output signals for both row and column reconfiguration. It includes two processor implement/bypass multiplexers 252EW and 252NS. These multiplexers are both input-selected by the output from an OR gate 254 having two inputs provided by AND gates 256SE and 256SW. AND gate 256SE has input signals provided by REQSE output signals for both rows and columns. The inputs to AND gate 256SW are the REQSW (Rows) input signal and REQSW (Cols) output signal.

The operation of cell 250 is as follows. Gate 256SE ANDs the row and column REQSE output signals; if both signals are 1, indicating requests for both row and column connection to an SE neighbour, the double site condition has occurred and OR gate 254 receives a 1 input. A 1 signal accordingly reaches both multiplexers 252EW and 252NW, so that their processor bypass inputs 258EW and 258NS are connected respectively to eastern and southern outputs. Similarly, if the REQSW (Rows) input and REQSW (Cols) output signals are both 1, indicating attempted row and column connection to an SW neighbour, AND gate 256SW outputs 1 to OR gate 254 and multiplexer bypass both NS and EW is implemented once more. It should be noted that processor bypass by multiplexer means in the event of processor failure, such as the AND gate 40/multiplexer 14 arrangement of cell 10, is not required. In cell 250, output request and availability signals are controlled to both eastern and southern neighbours by processor state, so these signals provide for bypass in both directions without further circuitry. It will be noted that the double site condition is avoided in cell 250 with the use of only three additional gates.

Figure 11:
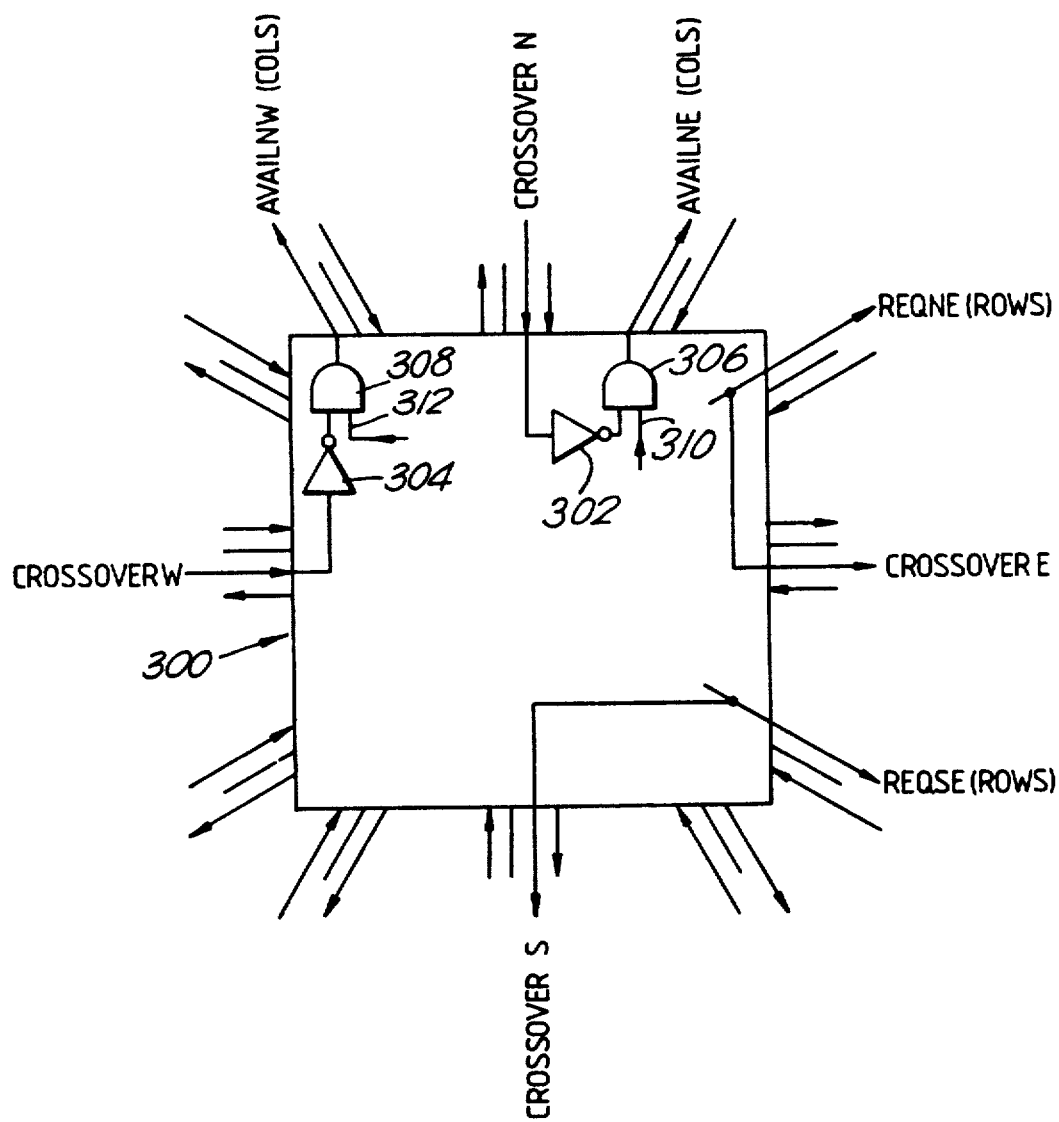
FIGS. 11 and 12 show cells arranged to avoid improper crossover.

Referring now to FIG. 11, there is shown a processing cell 300 equivalent to cell 250 of FIG. 10 with additional circuitry to avoid improper crossovers. The cell 300 has two additional inputs, crossover N and Crossover W, and also two additional outputs, Crossover E and Crossover S. Crossover N and W inputs are connected to inverters 302 and 304 having outputs fed to respective AND gates 306 and 308. The inverter outputs are ANDed with signals at 310 and 312 which in cell 250 would have been the AVAILNW (Columns) and AVAILNE (Columns) signals respectively. This provides new AVAIL signals in the corresponding directions. Crossover E and S outputs are connected to REQNE (Rows) and REQNE (Rows) respectively.

The cell 300 operates as follows. In an array, a bit is passed from cell to cell 300 in both the NS and WE directions. The NS direction input bit indicates whether or not a northern neighbour cell is outputting a row request in the SE direction; if so, the AVAILNE (Cols) signal for a southern neighbour cell is caused to be inhibited. This avoids the FIG. 9(a) condition. Similarly, the WE direction input bit indicates whether or not a western neighbour cell has output a row request signal to the NE; if so, the AVAILNW (Cols) signal for an eastern neighbour cell is inhibited. This avoids the FIG. 9(b) condition.

Figure 12:
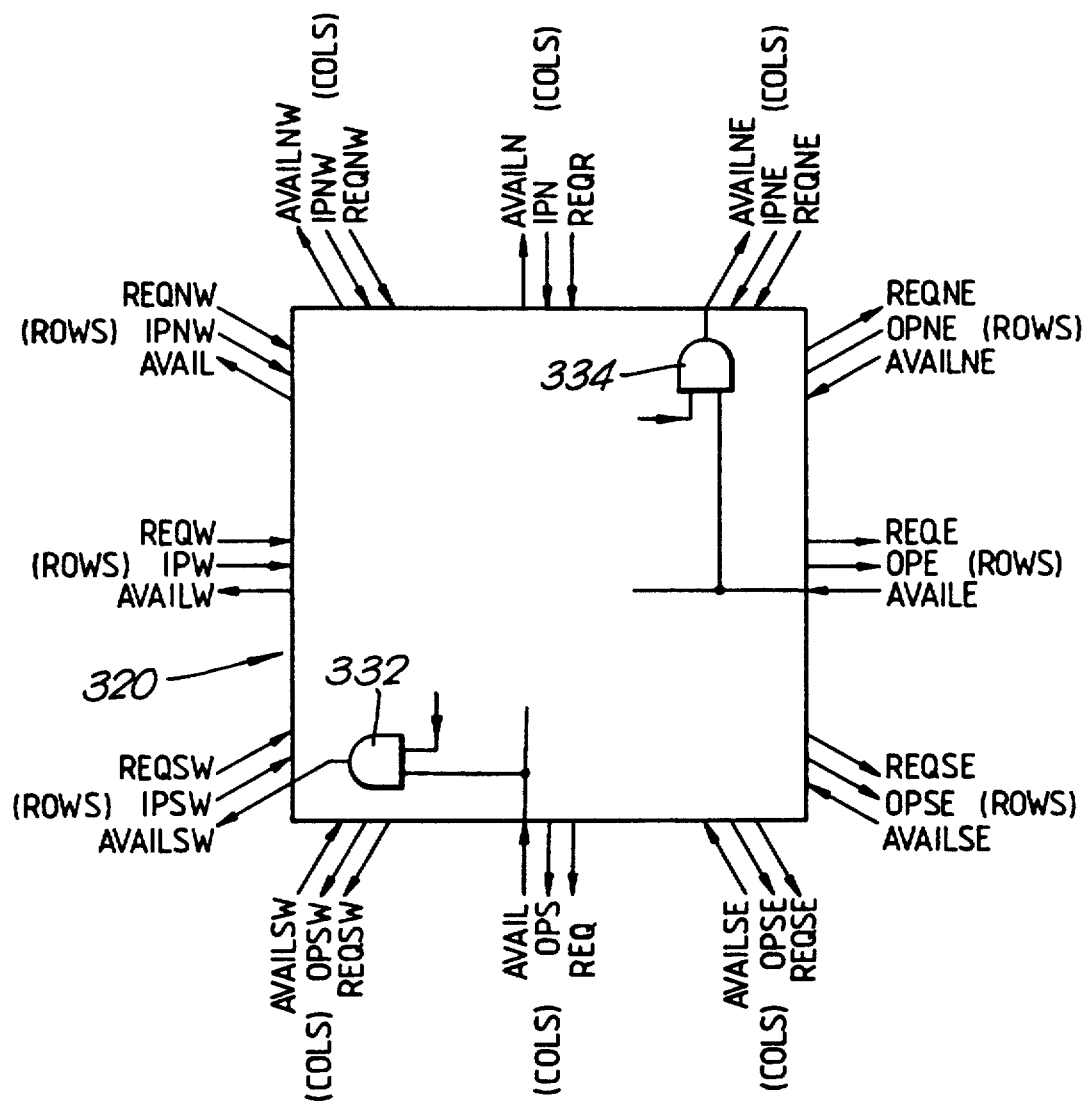

FIG. 12 shows an alternative means for avoiding improper crossovers, this not requiring additional bits. A cell 320 has AND gates 332 and 334 with outputs providing AVAILSW (Rows) and AVAILNE (Cols) signals respectively. The gates 332 and 334 provides the signals by ANDing the AVAILS (Cols) or AVAILE (Rows) input signal with what in cell 250 would have been the AVAILSW (Rows) or AVAILNE (Cols) output signal respectively. In other words, modified AVAILSW (Rows) and AVAILNE (Cols) signals are produced by ANDing the corresponding unmodified (Col) or (Row) signal in either case with the respective (Row) or (Col) AVAIL input signal at 45° to it.

The cell 320 operates as follows. Referring to FIG. 9(a) once more, cell 240a₄ outputs a TRUE row availability signal to cell 240a₃ at all times other than when a row connection exists between cells 240a₁ and 240a₄. Accordingly, cell 240a₃ uses its TRUE or FALSE row availability signal to modify its column availability output signal to cell 240a₂. This is achieved by gate 334 in cell 240a₃ ANDing the AVAILE (Rows) input signal with the internal equivalent of the cell 250 AVAILNE (Cols) output signal to provide a modified AVAILNE (Cols) output signal to cell 240a₂ Priority to row connection is given in this case.

Similarly, referring to FIG. 9(b), cell 240b₄ outputs a TRUE column availability signal to cell 240b₂ at all times other than when a column connection exists between cells 240b₁ and 240b₄. As before, gate 332 in cell 240b₂ ANDs this column availability input signal with its internally generated AVAILSE (Rows) signal to produce a modified AVAILSE (Rows) output signal to cell 240b₃. Here priority is given to column connection.

The FIG. 11 arrangement requires only two additional gates to inhibit improper crossover. It does however reduce percentage cell utilisation. This arises because faulty cells output FALSE availability signals in all directions. Neighbours of a cell cannot distinguish FALSE availability signals indicating faulty cells from those indicating the presence of an SE/NW connection. This means that a link cannot be formed between two cells respectively above and to the left of a faulty cell. The situation could of course be alleviated by providing an SE/NW bypass implementable in the event of cell failure under appropriate request and availability conditions.

I claim:

1. A processing cell for use in constructing fault tolerant cell arrays including processing cells connected to form rows and columns, the cell including:
   (a) a processor for performing electronic operations on input signals and having means to perform self-testing for proving an electronic indication of whether or not it is fault-free;
   (b) at least one set of cell interconnection lines for connection to other cells in an array, the lines comprising a respective subset of first, second and third lines for each of the following:

(1) processor input signals,
(2) processor output signals,
(3) input availability signals,
(4) input request signals,
(5) output availability signals, and
(6) output request signals,
wherein each processor input signal line is associated with a respective input request signal line and a respective output availability signal line, and each processor output signal line is associated with a respective output request signal line and a respective input availability signal line;

(c) request signal generating means connected to the processor to receive a processor operational state indication and also connected to request and availability signal inputs, the request signal generating means being arranged to provide output request signals reflecting both said processor operational state and said input request and availability signals;

(d) availability signal generating means connected to the processor to receive said processor operational state indication and also connected to said request and availability signal inputs, the availability signal generating means being arranged to provide output availability signals reflecting both said processor operational state said and input request and availability signals; and (e) cell implementing means arranged either to route said input signals to the processor or to isolate it from such signals in accordance respectively with whether or not the cell receives appropriate said input request said and input availability signals and the processor is fault-free.

2. A processing cell according to claim 1 including a further input line and a further output line, these lines being arranged either to route additional signals to and from the processor or to bypass it in accordance with whether or not the processor is fault-free.

3. A processing cell according to claim 1 wherein the cell implementing means, request signal generating means and availability signal generating means include respective gating means for operating a priority scheme in which use of each of the second processor input and output lines is preferred to use of the respective third, and use of each of the first processor input and output lines is preferred to use of the respective second.

4. A fault tolerant processing cell array including processing cells connected to form rows and columns, and wherein:
(1) each cell includes:
(i) a processor for performing electronic operations on input signals and having means to perform self-testing for providing an electronic indication of whether or not it is fault-free;
(ii) at least one set of cell signal lines, the set comprising a respective subset of first, second and third lines for each of the following:
(a) processor input signals,
(b) processor output signals,
(c) input availability signals,
(d) input request signals,
(e) output availability signals, and
(f) output request signals,
wherein each processor input signal line is associated with a respective input request signal line and a respective output availability signal line, and each processor output signal line is associated with a respective output request signal line and respective input availability signal line;
(iii) request signal generating means connected to the processor to receive a processor operational state indication and also connected to request and availability signal inputs, the request signal generating means being arranged to provide output request signals reflecting both said processor operational state and said input request and availability signals;
(iv) availability signal generating means connected to the processor to receive said processor operational state indication and also connected to said request and availability signal inputs, the availability signal generating means being arranged to provide output availability signals reflecting both said processor operational state said and input request and availability signals; and
(v) cell implementing means arranged either to route said input signals to the processor or to isolate it from such signals in accordance respectively with whether or not the cell receives appropriate said input request and said input availability signals and the processor is fault-free; and
(2) the array includes cell interconnection lines each connecting a respective input line of one cell to a respective output line of like signal type of another cell such that:
(i) first, second and third processor input signal lines and their respective associated lines are connected to first, second and third neighbouring cells in a first adjacent column where available; and
(ii) first, second and third processor output signal lines and their respective associated lines are connected to first, second and third neighbouring cells in a second adjacent column where available.

5. A processing cell according to claim 4 wherein the array of cells is accompanied by an input cell array and an output cell array arranged respectively to provide input to and output from operational rows of the processing cell array only.

6. A fault tolerant processing cell array including processing cells connected to form rows and columns, and wherein:
(1) each cell includes:
(i) a processor for performing electronic operations on input signals and having means to perform self-testing for providing an electronic indication of whether or not it is fault-free;
(ii) first and second sets of cell signal lines, each set comprising a respective subset of first, second and third lines for each of the following:
(a) processor input signals,
(b) processor output signals,
(c) input availability signals,
(d) input request signals,
(e) output availability signals, and
(f) output request signals,
wherein each processor input signal line is associated with a respective input request signal line and a respective output availability signal line, and each processor output signal line is associated with a respective output request signal line and a respective input availability signal line;
(iii) request signal generating means connected to the processor to receive a processor operational state indication and also connected to request and availability signal inputs, the request signal generating means being arranged to provide output request signals reflecting both said processor operational state and said input request and availability signals;

(iv) availability signal generating means connected to the processor to receive said processor operational state indication and also connected to said request and availability signal inputs, the availability signal generating means being arranged to provide output availability signals reflecting both said processor operational state and said input request and availability signals; and (v) cell implementing means arranged either to route said input signals to the processor or to isolate it from such signals in accordance respectively wither whether or not the cell receives appropriate said input request and said input availability signals and the processor is fault-free;

(2) the array includes cell interconnection lines each connecting a respective input line of one cell to a respective output line of like signal type and set of another cell such that:

(i) first, second and third processor input signal lines in the said first set and their respective associated lines are connected respectively to first, second and third neighbouring cells in a first adjacent column wherein available;

(ii) first, second and third processor output signal lines in the said first set and their respective associated lines are connected respectively to first, second and third neighbouring cells in a second adjacent column where available;

(iii) first, second and third processor input signal lines in the said second set and their respective associated lines are connected respectively to first, second and third neighbouring cells in a first adjacent row where available; and (iv) first, second and third process output signal lines in the said second set and their respective associated lines are connected respectively to first, second and third neighbouring cells in a second adjacent row where available; and (3) gating means are associated with cell output availability signal lines to provide for the processor to be bypassed in response to occurrence of double site and improper crossover situations.

* * * * *